United States Patent [19]

Szeto

[11] Patent Number: 4,743,899
[45] Date of Patent: May 10, 1988

[54] DECODER/MULTIPLEXER CIRCUIT INCLUDING MULTI-EMITTER TRANSISTORS

[75] Inventor: Simon Szeto, South San Francisco, Calif.

[73] Assignee: Advanced Micro Devices, Inc., Sunnyvale, Calif.

[21] Appl. No.: 908,478

[22] Filed: Sep. 17, 1986

[51] Int. Cl.$^4$ .................. H04Q 3/52; H03K 19/086
[52] U.S. Cl. ..................... 340/825.860; 307/243; 307/463; 340/825.930; 357/36
[58] Field of Search .............. 340/825.86, 825.93; 357/36, 42, 45; 379/112; 307/299 A, 243, 248, 463, 467, 500, 501, 303, 455; 370/112, 68.1

[56] References Cited

U.S. PATENT DOCUMENTS

| | | | |
|---|---|---|---|
| 3,402,330 | 9/1968 | Archer | 307/299 A |
| 4,394,657 | 7/1983 | Isogai et al. | 340/825.93 |
| 4,524,443 | 6/1985 | Crocker et al. | 307/243 |
| 4,616,358 | 10/1986 | Rehm et al. | 370/112 |

Primary Examiner—Donald J. Yusko
Attorney, Agent, or Firm—Patrick T. King; Davis Chin

[57] ABSTRACT

A decoder/multiplexer circuit for selecting one of a plurality of input signals includes an array formed of a plurality of decode transistors. All of the collectors of the decode transistors are commonly formed in a large epitaxial pocket, thereby reducing the amount of chip area required.

10 Claims, 3 Drawing Sheets

DECODER/MULTIPLEXER CIRCUIT INCLUDING MULTI-EMITTER TRANSISTORS

BACKGROUND OF THE INVENTION

This invention relates generally to electronic circuitry and more particularly, it relates to a decoder/multiplexer circuit which is formed with smaller chip area than conventionally built decoders.

Since decoder/multiplexer circuits heretofore have a wide range of applications in electronic circuitry such as in digital equipment including minicomputers and microprocessor systems, it is advantageous to increase the economy of manufacturing of these decoder/multiplexer circuits and to decrease the amount of chip area required. It would therefore be desirable to provide a decoder/multiplexer circuit having a size reduced from those which are traditionally available. Further, it would be expedient to form the decoder/multiplexer circuit with a smaller number of transistor components.

The decoder/multiplexer circuit of the present invention has particular application in a quad exchange power controller which is manufactured and sold by Advanced Micro Devices, Inc., Sunnyvale, Calif., under part No. Am7938. The decoder/multiplexer circuit is fabricated as a part of the power controller which is an integrated circuit of a single-chip package. The power controller is described and illustrated in a co-pending application Ser. No. 908,475 filed on Sept. 17, 1986, which is assigned to the same assignee as this invention.

SUMMARY OF THE INVENTION

Accordingly, it is a general object of the present invention to provide an improved decoder/multiplexer circuit in which its size is reduced with respect to conventional decoder/multiplexer circuitry.

It is another object of the present invention to provide a decoder/multiplexer circuit which is formed with smaller chip area than conventionally built decoders.

It is another object of the present invention to provide a decoder/multiplexer circuit which is formed with a smaller number of transistor components.

It is still another object of the present invention to provide a decoder/multiplexer circuit which includes a plurality of decode transistors in which all of the collectors thereof are commonly formed in a large epitaxial pocket.

In accordance with these aims and objectives, the present invention is concerned with the provision of a decoder/multiplexer circuit for selecting one of a plurality of input signals which includes a plurality of substantially parallel input lines. A plurality of input signals is provided in which each one of the plurality of input signals is connected to one end of a corresponding one of the input lines. A plurality of decode transistors are provided in which each is formed with a collector, a long base strip, and a preselected number of emitters. An output line is coupled to the other end of each of the input lines. A plurality of address input signals are connected to the base strips of the plurality of decode transistors. Each of the collectors of the decode transistors are commonly formed in a large epitaxial pocket. Each of the base strips are formed with the preselected number of emitters for connection to certain ones of the input lines. The decode transistors are responsive to the address signals for passing each one of the input signals in accordance with an address code to the output line.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
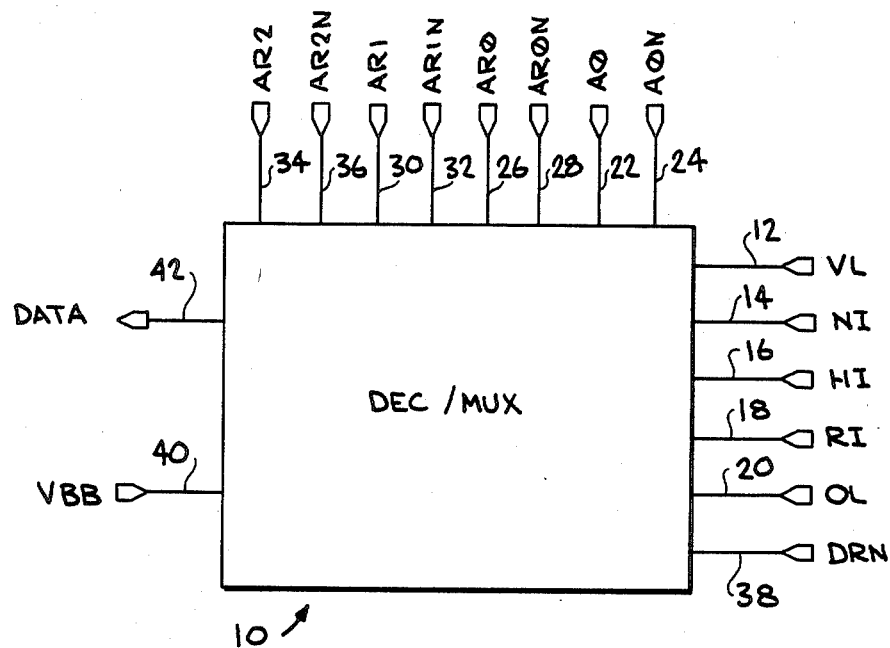
FIG. 1 is a block diagram of a decoder/multiplexer circuit of the present invention.

Referring now in detail to the various drawings, there is shown in FIG. 1 a block diagram of a decoder/multiplexer circuit 10 of the present invention. The decoder/multiplexer circuit 10 receives a set of multiple status or input logic signals, which may represent line-status conditions on a power line, on input lines 12, 14, 16, 18 and 20. These status logic signals consist of input signals VL on the input line 12, NI on the input line 14, HI on the input line 16, RI on the input line 18, and OL on the input line 20. For example, the input signal VL corresponds to a low-voltage condition which becomes activated to a high or "1" logic level when the line voltage decreases below a preset voltage level. The input signal NI corresponds to an open-loop (no current) condition which becomes activated to a "1" logic level when the line current decreases below a preset current level. The input signal HI corresponds to a current overload (high current) condition which becomes activated to a "1" logic level when the line current exceeds a predetermined value indicative of the maximum current available. The input signal RI corresponds to a reverse-current condition which becomes activated to a "1" logic level when the current is in the reverse direction and exceeds a preselected value. Finally, the input signal OL corresponds to an overload-temperature condition which becomes activated to a "1" logic level when a preselected high temperature, such as 140° C., is exceeded.

The decoder/multiplexer circuit 10 also receives a true input control signal A0 and its complement A0N on respective input lines 22 and 24. True and complement address input signals AR0, AR0N, AR1, AR1N, AR2 and AR2N are received on input lines 26, 28, 30, 32, 34 and 36, respectively. A data latch input signal DRN is applied on input line 38, and a bias voltage signal VBB is applied on input line 40. A single output line 42 is used to generate a data out signal DATA from the multiplexer 10. In operation, each of the five status logic signals corresponding to the line-status conditions on the power line can be selected to appear at the output line 42 as the data output signal in response to the true and complement address input signals AR0 . . . AR2N.

Figure 2:
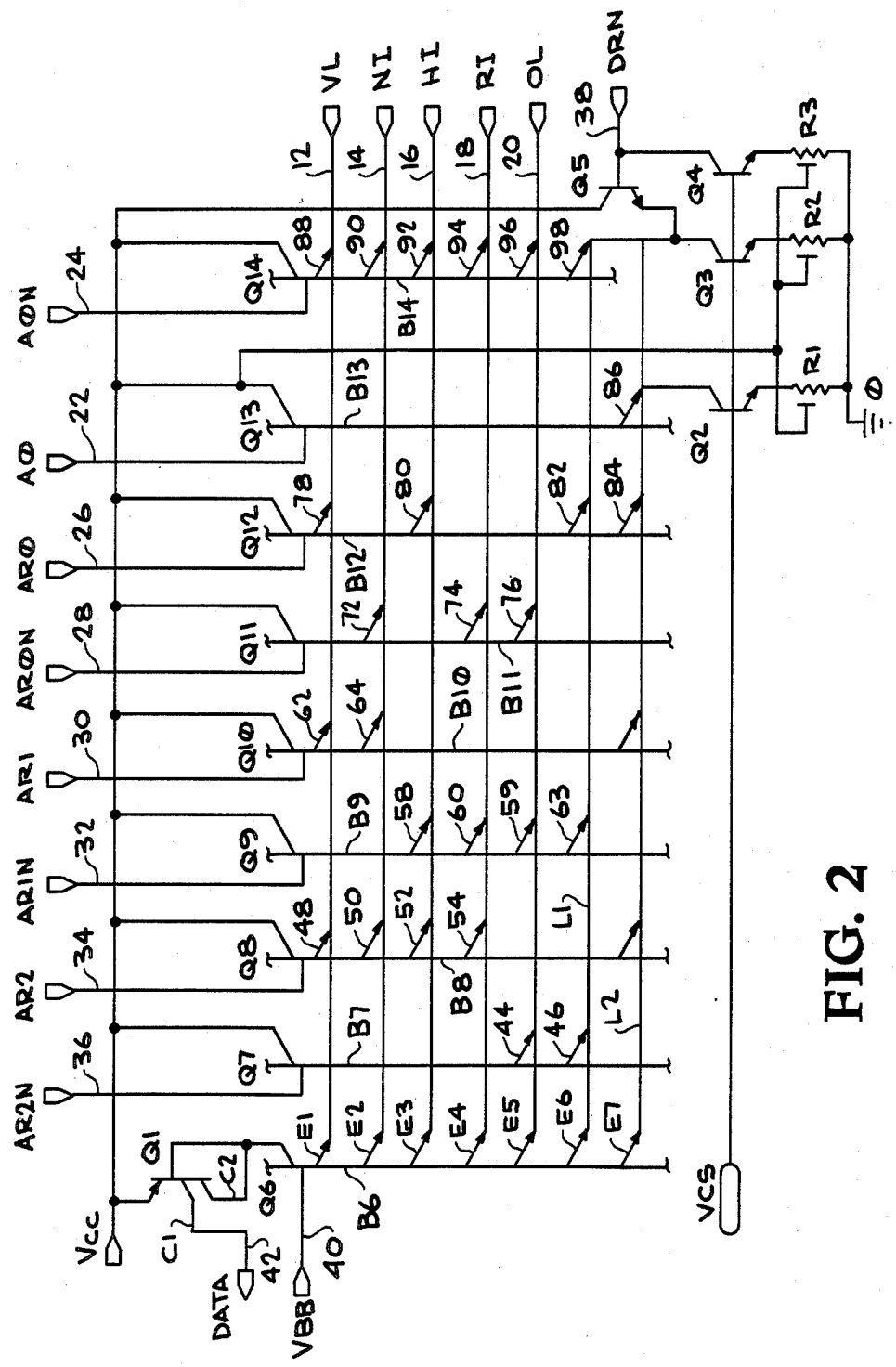
FIG. 2 is a detailed schematic circuit diagram of the decoder/multiplexer circuit of FIG. 1.

In FIG. 2, there is shown a detailed schematic circuit diagram of the decoder/multiplexer circuit 10 of FIG. 1. The multiplexer 10 includes an array formed of a plurality of decode transistors Q7 through Q12 of the bipolar NPN-type. The multiplexer also includes a first control transistor Q13 and a second control transistor Q14, both being of the bipolar NPN-type. All of the collector regions of the decode and control transistors Q7 through Q14 are commonly formed together in a large epitaxial layer pocket which is tied to a supply voltage or potential VCC. The true and complement address input signals AR2N ... AR0 and the true and complement control input signals A0 and A0N are connected to the bases of the decode and control transistors Q7 through Q14, respectively. There are provided a plurality of substantially parallel input lines 12, 14, 16, 18 and 20 in which each one thereof is connected to one of the status logic signals VL, NI, HI, RI and OL at its one end.

An output transistor Q6 of the bipolar NPN-type is formed with a collector, a long base strip B6 and a plurality of emitters E1 through E7. Each of the emitters E1 through E7 is connected to the other end of one input lines 12-20. In other words, the emitter E1 is connected to the input line 12, the emitter E2 is connected to the input line 14, and so on. Each of the decode transistors Q7 through Q12 is also formed with a long base strip B7 to B12, respectively. The base strip B7 is provided with emitters 44 and 46. The emitter 44 is connected to the input line 20. The emitter 46 is connected to a common line L1 which is parallel to the input lines. The base strip B7 is left open with respect to the input lines 12, 14, 16, and a common line L2 which is also parallel to the input lines. The base strip B8 is provided with emitters 48, 50, 52, and 54 which are connected to respective input lines 12, 14, 16, and 18. The base strip B8 is left open with respect to the input lines 20, L1 and L2. The base strip B9 is provided with emitters 58, 60, 59, and 63 which are connected to the respective input lines 16, 18, 20 and L1. The base strip B9 is left open with respect to the input lines 12, 14, and L2. The base strip B10 is provided with emitters 62 and 64 which are connected to the respective input lines 12 and 14. The base strip B10 is left open with respect to the input lines 16, 18, 20, L1 and L2.

Further, the base strip B11 is provided with emitters 72, 74 and 76 which are connected to the respective input lines 14, 18 and 20. The base strip B11 is left open with respect to the input lines 12, 16, L1 and L2. The base strip B12 is provided with emitters 78, 80, 82 and 84 which are connected to the respective input lines 12, 16, L1 and L2. The base strip B12 is left open with respect to the input lines 14, 18 and 20. The base strip B13 of the control transistor Q13 is provided with an emitter 86 which is connected to the line L2 and is left open with respect to the other input lines. The base strip B14 of the control transistor Q14 is provided with emitters 88, 90, 92, 94, 96 and 98 which are connected to the respective input lines 12, 14, 16, 18, 20 and L1. In this manner, the array is selectively programmed to have either an emitter connection or an open with respect to the input lines 12-20, L1 and L2.

The decoder/multiplexer circuit 10 further includes a current mirror transistor Q1 of the bipolar PNP-type which has its emitter connected to the supply potential VCC and one of its collectors C1 connected to the output line 42. The current mirror transistor Q1 has its base connected to the other collector C2 and to the collector of the output transistor Q6. The base of the output transistor Q6 is connected to the input line 40 for receiving the bias voltage VBB. A converter transistor Q5 is provided for converting a logic voltage to a current and has its collector connected to the supply potential VCC and its emitter connected to the common line L1. The base of the converter transistor Q5 is connected to the input line 38 for receiving the data latch input signal DRN defining a logic voltage. A first current source formed of transistor Q2 and a resistor R1 is connected between the common line L2 and a ground potential. A second current source formed of transistor Q3 and a resistor R2 is connected between the input line L1 and the ground potential. A third current source formed of transistor Q4 and a resistor R3 is connected between the base of the converter transistor Q5 and the ground potential. The bases of the transistors Q2, Q3 and Q4 are connected together and to a reference voltage VCS. All of the input signals applied to the decoder/multiplexer circuit 10 are normally current signals. In order to accommodate voltage level logic inputs, the converter transistor Q5 and the associated first through third current sources are used. A voltage level logic consisting of the input signal DRN is applied to the input line 38. Dependent upon this voltage level with respect to the bias voltage VBB, the current from the second current source transistor Q3 will be passed through either the converter transistor Q5 or the control transistor Q14.

In operation, when the true and complement control signals are A0=0 and A0N=1, the decoder/multiplexer circuit 10 is disabled since the second control transistor Q14 is turned on and the first control transistor Q13 is turned off. As a result, current flows through each of the emitters 88 through 98 and thus prevents all of the input logic signals VL, NI, HI, RI and OL from passing through the output transistor Q6 and the current mirror transistor Q1 to the output line 42. When the control signals are A0=1 and A0N=0, the multiplexer 10 is enabled so that one of the input logic signals will pass through to the output line 42 in response to an address code applied to the address input terminals 26 through 36. In normal operation, it will be assumed that the true control signal is A0=1.

The code for the address input signals in order to access the particular status logic signal at the output line 42 for the circuit of FIG. 2 is listed below:

| Address Code | | | | Selected Status |
|---|---|---|---|---|
| A0 | AR2 | AR1 | AR0 | Logic Signal |
| 1 | 0 | 0 | 0 | VL (low-voltage) |
| 1 | 0 | 0 | 1 | NI (open-loop current) |
| 1 | 0 | 1 | 0 | HI (overload-current) |
| 1 | 0 | 1 | 1 | RI (reverse current) |
| 1 | 1 | 0 | 1 | OL (overload-temperature) |
| 1 | 1 | 1 | 0 | DRN (data latch input) |
| 0 | X | X | X | Address latch read back |

As a specific example, in order to access the status logic signal VL indicative of a low voltage, the address input signals are AR2=0, AR1=0 and AR0=0 which are applied to the bases of the transistors Q8, Q10 and Q12. Thus, these transistors are all turned off so that no current flows through the emitters 48, 62 and 78. Since the complement address input signals AR2N=1, AR1N=1 and AR0N=1 are applied to the bases of the transistors Q7, Q9 and Q11, these transistors will be turned on so as to cause current to flow through the emitters 44, 58, 60, and 72. This prevents the input signals NI, HI, RI and OL from passing through to the output line 42. As a result, only the input signal VL will pass through the output transistor Q6 and the load transistor Q1 to the output line 42. In like manner, it can be shown that for each of the other codes listed above, the logic signals NI, HI, RI and OL can be accessed.

Figure 3:
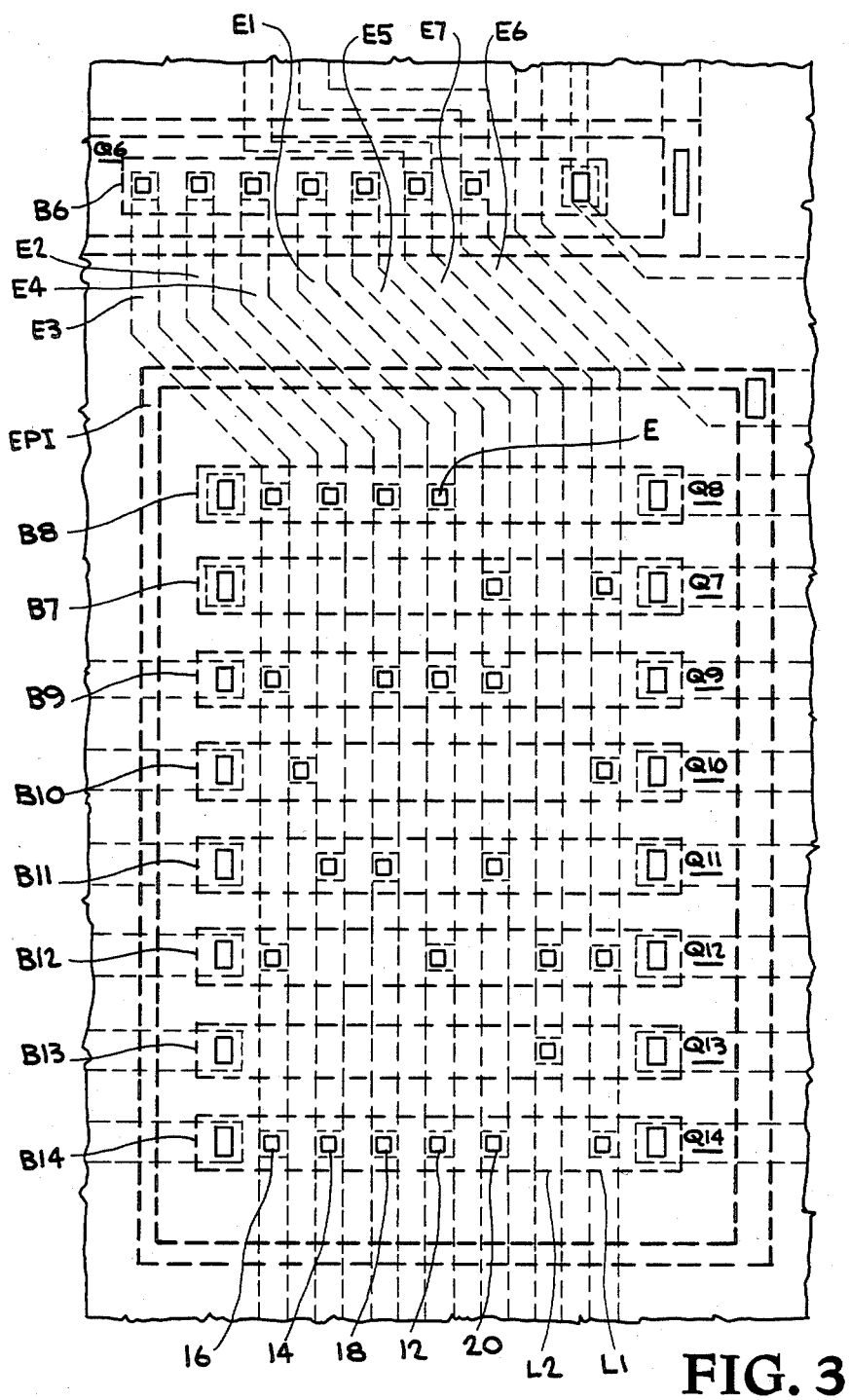
FIG. 3 is a top plan view of the decoder/multiplexer circuit, illustrating its design layout.

In FIG. 3, there is depicted a top plan view of the decoder/multiplexer circuit, illustrating its design layout. As can be seen, the array formed of the transistors Q7 through Q14 having their collectors which are all fitted into one large epitaxial layer or pocket EPI. In this pocket, all of the collector regions of the transistors Q7 through Q14 are commonly formed and tied to the supply potential VCC. The base strips B7-B14 are arranged horizontally within the pocket for receiving the true and complement address input signals AR0 . . . AR2N, as well as the control signals A0 and A0N. The input lines 12, 14, 16, 18 and 20 are arranged vertically for receiving the respective status logic signal VL, NI, HI, RI and OL. Contact connections E are placed selectively so as to program the various base strips to form the plural emitters 44-98 for certain ones of the transistors Q7 through Q14 with the input lines 12 through 20, L1 and L2.

In the upper portion of FIG. 3, there is shown the output transistor Q6 with its long base strip B6 and its plurality of emitters E1 through E7.

From the foregoing detailed description, it can thus be seen that the present invention provides an improved decoder/multiplexer circuit which is formed of a plurality of transistors in which the collector regions thereof are commonly formed in one large epitaxial pocket, thereby reducing the amount of chip area required. Further the multiplexer circuit of the present invention is formed with a relatively small number of transistor components.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A decoder/multiplexer circuit for selecting one of a plurality of input signals comprising:
    a plurality of substantially parallel input lines;
    a plurality of input signals, each one of said plurality of input signals being connected to one end of a corresponding one of said input lines;
    a plurality of decode transistors, each formed with a collector, a long base strip, and a preselected number of emitters;
    an output line coupled to the other end of each of said input lines;
    a plurality of address input signals being connected to said bases of said plurality of decode transistors;
    each of the collectors of said decode transistors being commonly formed in a large epitaxial pocket, each of said base strips being formed with the selected number of emitters for connection to certain ones of said input lines; and
    said decode transistors being responsive to said address signals for passing each one of said input signals in accordance with an address code to said output line.

2. A decoder/multiplexer circuit as claimed in claim 1, further comprising an output transistor formed with a collector, a base, and a plurality of emitters, said output transistor having its collector coupled to the output line and its base coupled to a bias voltage, each emitter of said output transistor being connected to the other end of one of said input lines.

3. A decoder/multiplexer circuit as claimed in claim 2, further comprising a load transistor having its base connected to the collector of said output transistor and its collector connected to the output line.

4. A decoder/multiplexer circuit as claimed in claim 3, further comprising a control transistor having a plurality of emitters in which each emitter is connected to said one end of one of said input lines for disabling of said decoder/multiplexer circuit.

5. A decoder/multiplexer circuit as claimed in claim 1, wherein said decode transistors are bipolar transistors of the NPN-type.

6. A decoder/multiplexer circuit as claimed in claim 2, wherein said output transistor is a bipolar transistor of the NPN-type.

7. A decoder/multiplexer circuit as claimed in claim 3, wherein said load transistor is a bipolar transistor of the PNP-type.

8. A decoder/multiplexer circuit as claimed in claim 4, wherein said control transistor is a bipolar transistor of the NPN-type.

9. A decoder/multiplexer circuit as claimed in claim 1, further comprising a converter transistor converting a logic voltage to a current, the base of the converter transistor being connected to receive a voltage level logic input.

10. A decoder/multiplexer circuit as claimed in claim 1, wherein said collectors of said decoder transistors are connected to a supply potential.

* * * * *